United States Patent [19]

Melenotte

[11] Patent Number: 5,084,670
[45] Date of Patent: Jan. 28, 1992

[54] ELECTRICAL APPLIANCE WITH AN IMPROVED BATTERY COMPARTMENT

[75] Inventor: Denis Melenotte, La Balme De Sillingy, France

[73] Assignee: Deutsche ITT Industries GmbH, Freiburg, Fed. Rep. of Germany

[21] Appl. No.: 409,891

[22] Filed: Sep. 20, 1989

[30] Foreign Application Priority Data

Sep. 27, 1988 [FR] France .................. 88 12602

[51] Int. Cl.⁵ .................................. G01R 1/04
[52] U.S. Cl. .......................... 324/156; 361/392
[58] Field of Search ............... 324/156, 157; 361/392, 361/394, 395, 393, 399; 429/96-100; 354/288, 145.1, 149.11

[56] References Cited

U.S. PATENT DOCUMENTS

| | | | |
|---|---|---|---|
| 1,739,142 | 12/1929 | Hill et al. | 324/156 |
| 3,763,752 | 10/1973 | Ackerman et al. | 354/149.11 |
| 3,881,961 | 5/1975 | Nation | 429/100 |
| 4,297,635 | 10/1981 | Stevens | 324/156 |
| 4,317,628 | 3/1982 | Shimizu | 354/288 E |
| 4,660,126 | 4/1987 | Koster et al. | 324/156 |
| 4,661,889 | 4/1987 | Fushimoto | 361/395 |
| 4,713,609 | 12/1987 | Lopasio et al. | 324/156 |
| 4,752,539 | 6/1988 | Vatter | 429/98 |
| 4,847,170 | 7/1989 | Martin | 429/98 |
| 4,991,058 | 2/1991 | Watkins et al. | 361/394 |

FOREIGN PATENT DOCUMENTS

| | | | |
|---|---|---|---|
| 1533837 | 7/1968 | France | 354/288 E |
| 278830 | 12/1986 | Japan | 354/149.11 |
| 2098745 | 11/1982 | United Kingdom . | |

OTHER PUBLICATIONS

Machine Design, No. 10, Mar. 9, 1967, Burlington U.S., pp. 60-64; North et al., "Diaphragm Seals".

Primary Examiner—Kenneth A. Wieder
Assistant Examiner—Maura K. Regan
Attorney, Agent, or Firm—Thomas L. Peterson

[57] ABSTRACT

The invention relates to battery-operated appliances, and to an improved battery storage compartment. The battery (47, FIG. 7) lies in a compartment in a housing (20), the housing having a front face containing controls (28, 30) and a display (26). An aperture (44) lies in the housing front face to enable battery replacement from the front, and a cover (110) covers the aperture. The cover has ports (124) through which plugs (122) pass to reach sockets (32). A circuit board (36, FIGS. 3 and 4) lies behind the rear wall (134) of the battery compartment, the circuit board having about as great a width and length as the housing.

8 Claims, 5 Drawing Sheets

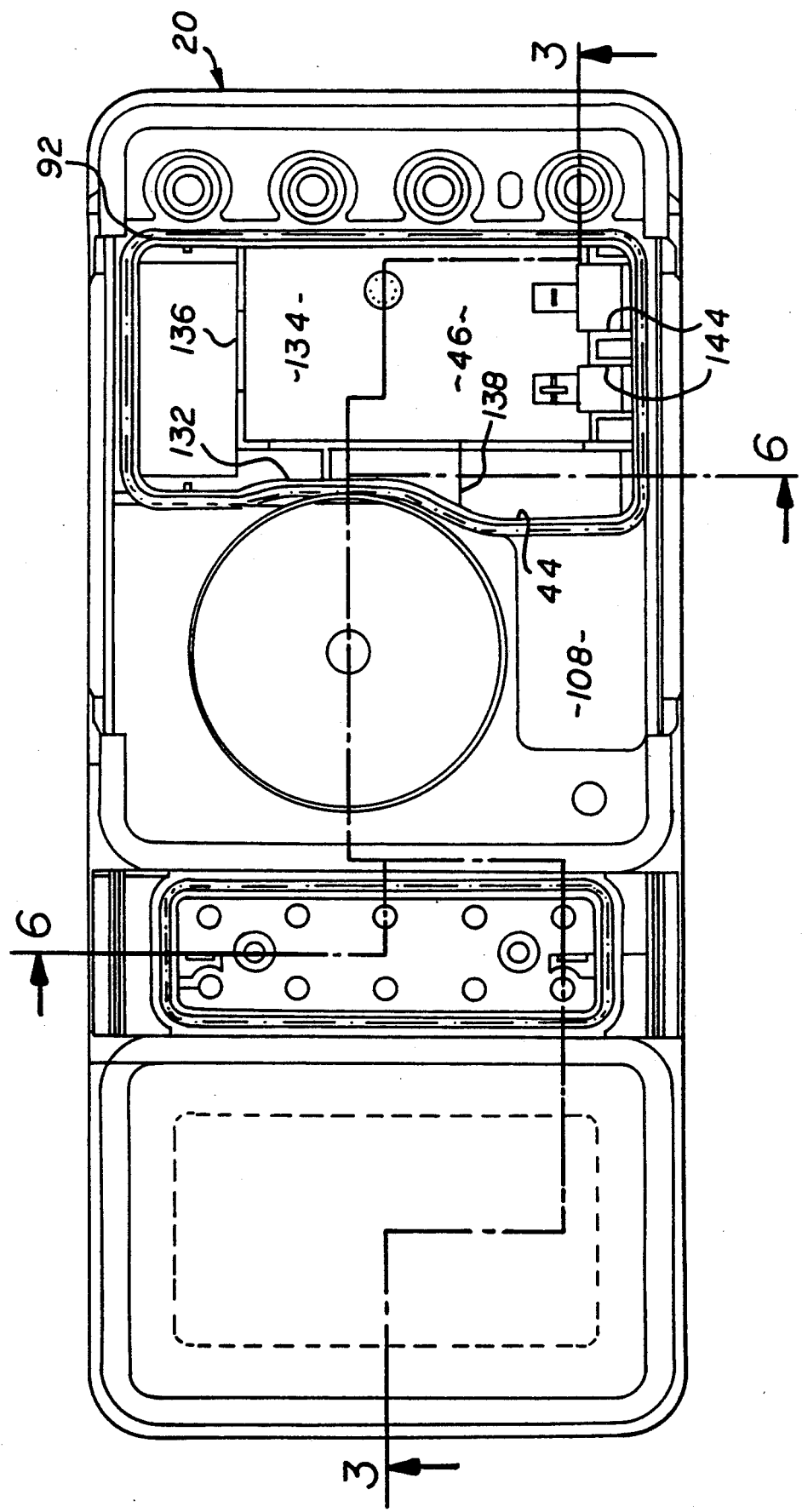

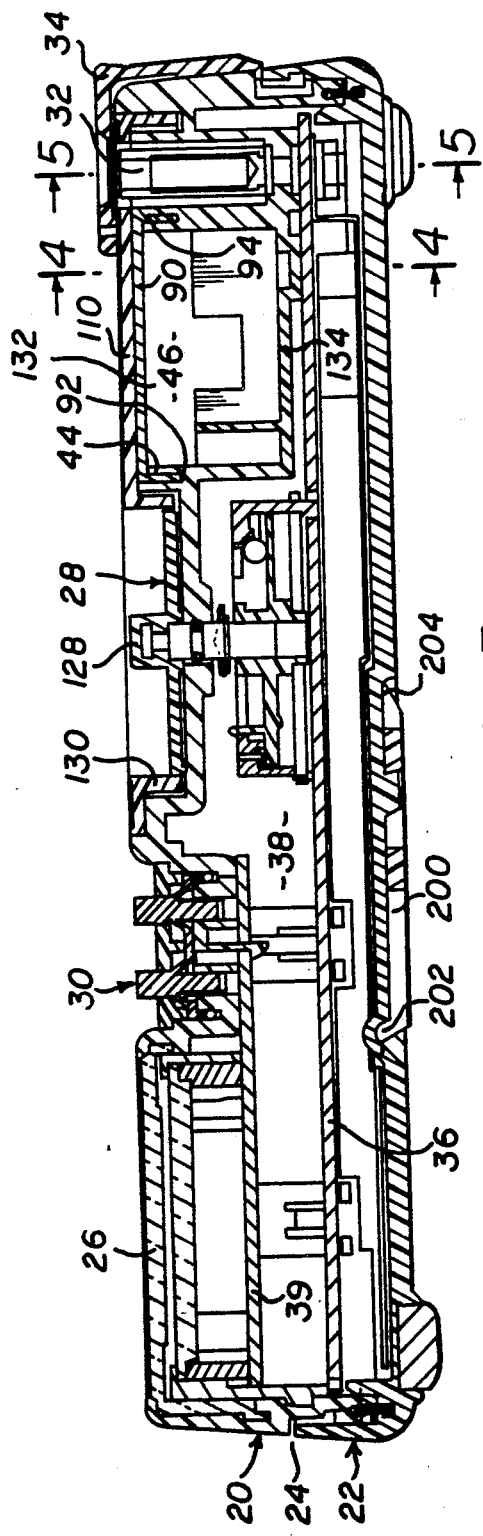

ELECTRICAL APPLIANCE WITH AN IMPROVED BATTERY COMPARTMENT

BACKGROUND OF THE INVENTION

Many battery-operated appliances (some are alternately operated from a wall socket) such as volt-ohmmeters and radios, include manually-operated controls and a display on the front face of the housing. A battery compartment is generally accessible from the rear face of the housing. The circuit board which contains most of the circuitry of the appliance and which lies near the rear of the housing, often has a cutout to accommodate the battery compartment. The cutout in the circuit board wastes space on the modern high density circuit boards. Also, the need to turn over the appliance to replace the battery is often an awkward process. A battery-operated appliance which facilitated battery replacement and avoided the need for a circuit board cutout to accommodate a battery compartment, would be of considerable value.

SUMMARY OF THE INVENTION

In accordance with one embodiment of the present invention, a battery operable appliance is provided which facilitates battery replacement and avoids some disadvantages of traditional battery placement. The appliance is of the type that has controls on the front face of its housing. The housing front face has an aperture that leads to a battery compartment. A cover usually covers the aperture. The appliance has a circuit board that lies behind the rear wall of the battery compartment. This allows a large circuit board to be used, that does not have a cutout for the battery compartment.

Especially in the case of a volt-ohmmeter appliance, the cover that covers the aperture in the housing front face can be provided with parts through which plugs can pass to reach sockets in the housing. This encourages leaving the plugs out of the sockets when the cover is off, so elements behind the cover that might otherwise be at a high voltage and which might be touched during battery replacement, are not at a high voltage.

According to other characteristics of the invention:
the removable cover has markings or indications that indicate the positions of a control switch;
the switch is equipped with a control knob which moves in a recess or hole of the cover;
the battery compartment is delimited by a side wall and by a bottom, through which pass means for connecting the voltage source electrically to an electrical circuit arranged in the inner cavity of the housing;
the sealing of the compartment relative to the inner cavity of the housing is obtained by means of a sealing diaphragm arranged between the bottom of the compartment and a bearing face located inside the housing, which may be the front face of a printed circuit, the diaphragm having the electrical connection means passing through it;
the battery compartment also receives at least one protection fuse; and
the compartment front opening is closed off by means of a sealing diaphragm arranged between the control housing and the removable cover.

Other characteristics and advantages of the invention will emerge from a reading of the following detailed description, for the understanding of which reference will be made to the accompanying drawings:

FIG. 2 is a front view of the integral part forming the upper half-housing of the appliance of FIG. 1;

FIG. 3 is a sectional view of the appliance of FIG. 1 along the line 3—3 of FIG. 2;

FIG. 4 is a sectional view along the line 4—4 of FIG. 3;

FIG. 6 is a sectional view of the appliance of FIG. 1 along the line 6—6 of FIG. 2.

DESCRIPTION OF THE PREFERRED EMBODIMENT

The following contains a somewhat brief description of the invention, which is followed by a more detailed description.

Figure 1:
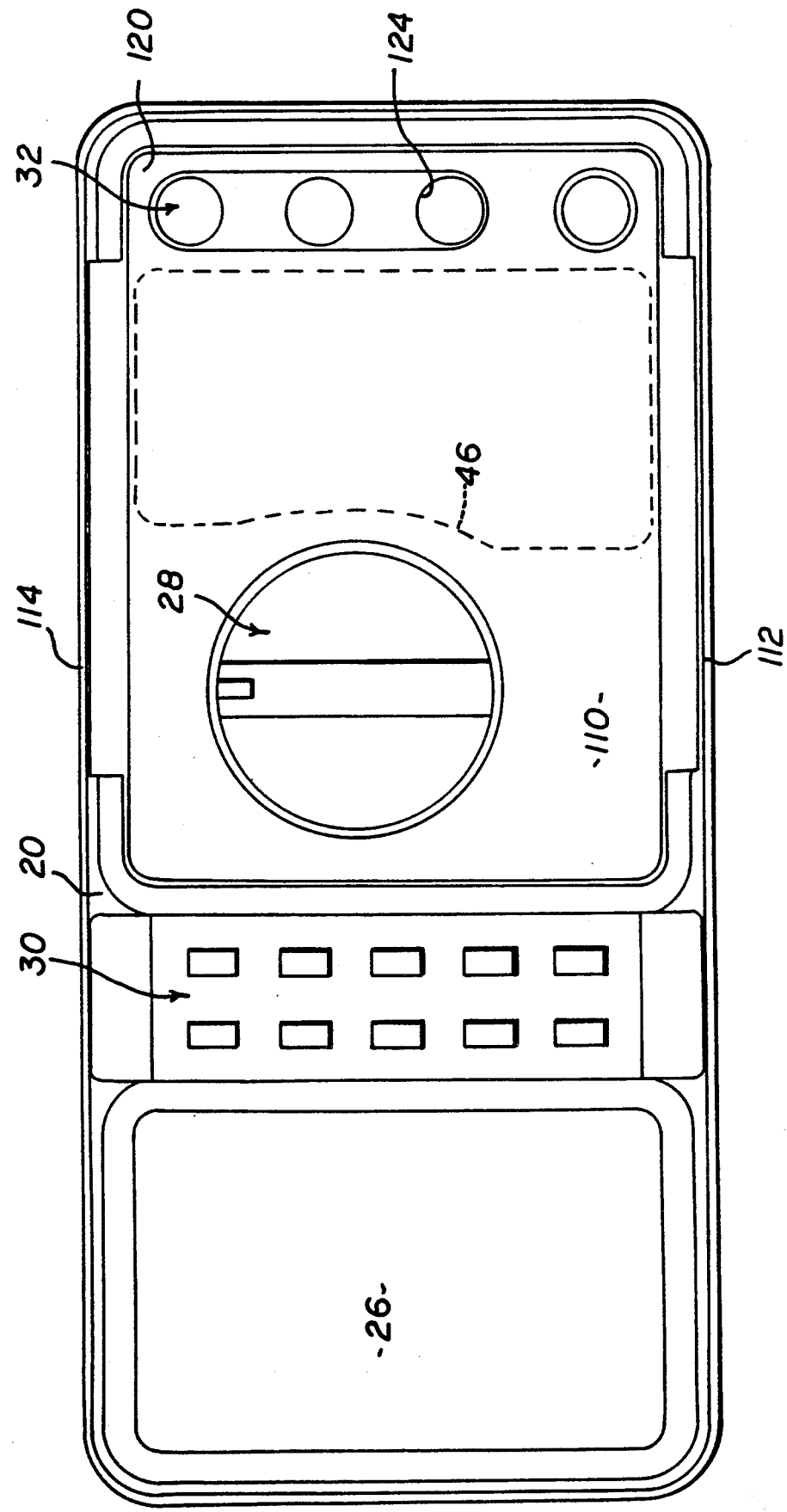
FIG. 1 is a front elevation view of the functional operating and control face of a battery-operated appliance produced according to the teaching of the invention, the particular appliance being a volt-ohmeter.
Figure 5:
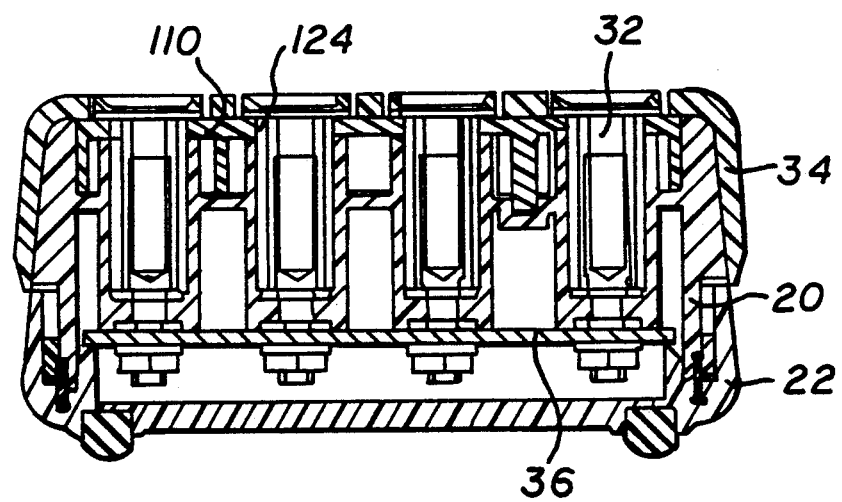
FIG. 5 is a sectional view along the line 5—5 of FIG. 3.

FIG. 1 shows the front face of a battery-operated (it could be energized through a wall outlet) volt-ohmmeter appliance. The appliance includes a housing 20 whose front face 21 includes a screen or display 26, a range switch 28, and a control keyboard 30. The switch and keyboard are manually-operated controls. Ports 124 pass plugs that connect to devices to be tested. A battery compartment 46 contains a battery that energizes the appliance.

Figure 7:
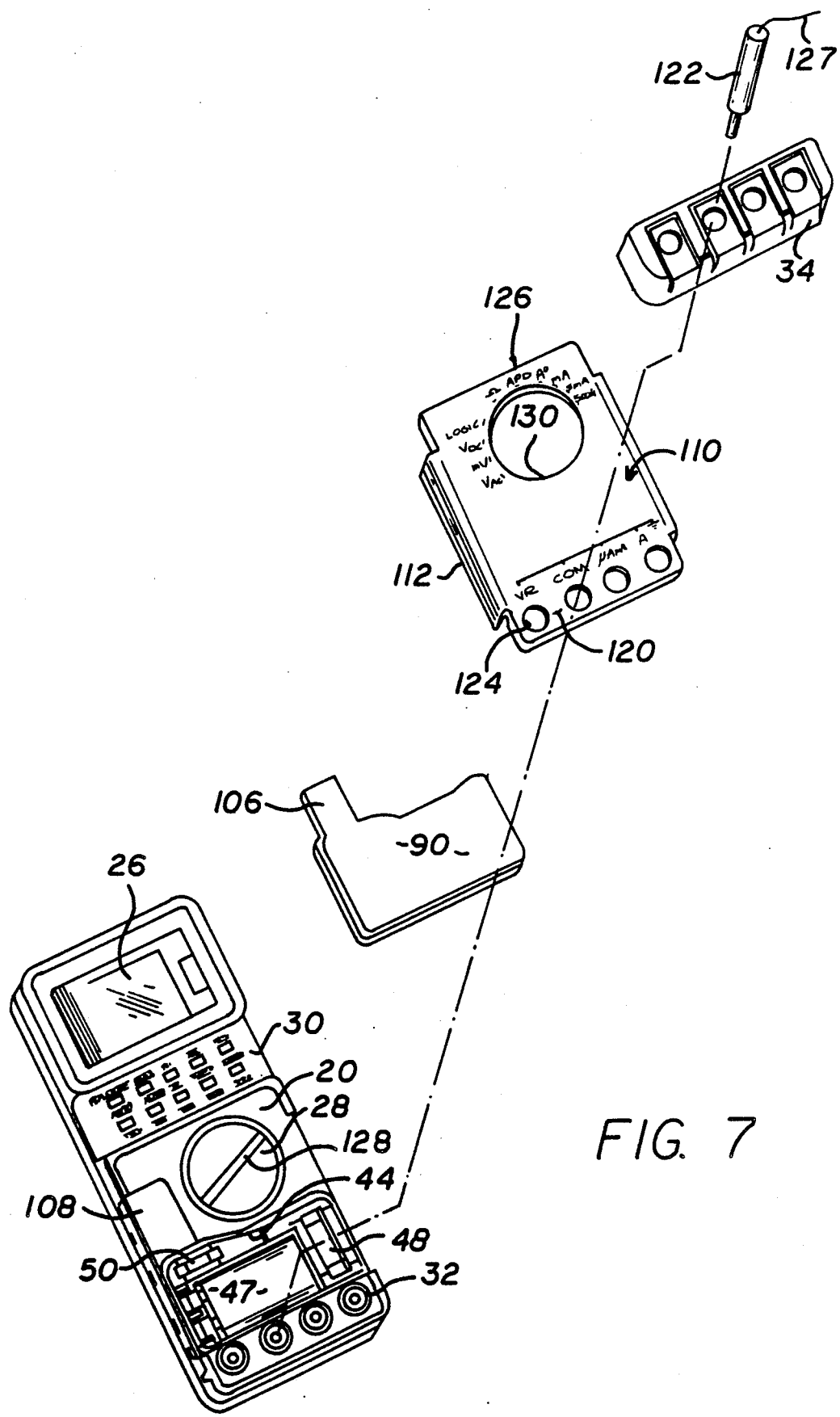
FIG. 7 is a simplified exploded perspective view making it possible to illustrate access to the battery housing of the measuring apparatus.

As shown in FIG. 7, the housing front face 21 has an opening or orifice 44 in its front face that opens to the battery compartment 46 that contains the battery 47. A removable cover 110 closes the opening. A locking device 34 can be used as part of the cover. An end part 120 of the cover has the ports 124 through which the plugs 122 pass to be received in socket 32 in the housing that lie behind and aligned with the ports of the closed cover. The plugs 122 are removed before the cover 110 is removed to replace the battery, which protects a person from touching an element behind the cover that is at a high voltage when replacing the battery. The volt-ohmmeter can measure voltages over 100 volts, usually to about 1000 volts, so the arrangement enhances safety.

The range switch 28 has a knob 128 with a control indicator 129 that can point to any of several markings 126 in the cover to indicate one of several different ranges of the appliance. When the cover 110 is removed, the absence of the markings 126 discourages operation of the appliance until the protective cover 110 is in a closed position. The knob can rotate about an axis extending perpendicular to the housing front face. The cover has a hole 130 that extends about the control knob 128, and the markings 126 are spaced about the hole. An elastomeric diaphragm 90 lies between the front of the battery compartment and the cover 110 to resist entrance of water.

As shown in FIGS. 3 and 4, the appliance has a main circuit board 36 which has a width (shown in FIG. 4) and length (shown in FIG. 3) that are about as wide and long as the housing (at least about 90% as great as the inside width and length of the housing). The circuit board 36 lies behind the rear wall 134 of the battery compartment, closer to the rear housing wall 23 and rear face 23f than the front housing wall 25 (both of which are substantially rectangular). An elastomeric diaphragm 146 lies against the rear face of the compartment rear wall. Electrical contacts 140, 145 extend from circuit board 36 through holes in the diaphragm 146 and the rear compartment wall 134 into the compartment. As shown in FIG. 3, the range switch 28 has a shaft 29 extending rearwardly to the circuit board 36 to move a rotatable contact across switch contacts at the circuit board.

The following is a more detailed description of the appliance.

The electrical measuring appliance illustrated in FIGS. 1 to 7 is a conventional appliance, of which the housing of general right-angled parallelepipedic shape is produced in the form of two half-housings 20 and 22, between which an offset 24 marking the parting plane can be seen.

It is also possible to see the screen 26 of a numerical display, the range switch 28, a control keyboard 30 and a series 32 of four receptacles or sockets making it possible to connect measuring leads (not shown in FIGS. 1 to 6) which generally terminate in plugs on the same side as the appliance and in probes on the same side as the measuring point.

FIGS. 3 to 7 also show a locking device 34 which makes it possible to retain the electrical connection plugs plugged into the measuring appliance, according to the characteristics of French Patent Application FR-A-2,587,849, to the content of which reference can advantageously be made. For the sake of clarity, the locking device 34 is not shown in FIG. 1.

The appliance possesses a main electronic circuit which is mounted on a main rectangular printed-circuit board 36 and on a secondary board 39 which are arranged inside the inner cavity 38 of the housing. The main electronic component and switching circuit of the appliance are not shown in the figures.

As can be seen from the figures, the main printed-circuit board 36 has a substantially rectangular contour equal to that of the two half-housings, and it therefore possesses a maximum surface for producing the circuits of the appliance.

The upper half-housing 20, on its functional upper face grouping together the control and operating members 26, 28, 30 and 32, has an orifice 44 opening upwards, to allow access to a cavity or compartment 46, in which an electrical battery 47 and protectional fuses 48 and 50 are arranged.

The sealing of the battery compartment 46 relative to the outside is obtained by means of a continuous and flexible solid diaphragm 90. The diaphragm 90 extends in one plane and delimits a substantially rectangular outer contour which corresponds to the contour of the access orifice 44 to the battery compartment 46. The contour of orifice 44 is delimited by a continuous groove 92, in which is received a gasket of circular cross-section 94 produced in one piece with the diaphragm 90.

To make it easier for the user to remove the flexible sealing diaphragm 90, the latter is equipped with a grasping tab 106 which is produced in one piece with the diaphragm 90 and which, when in place, is received in a recessed receptacle 108 formed in the upper face of the upper half-housing 20.

Access to the battery housing is likewise protected by a cover 110 made of rigid material, which covers the diaphragm 90 and which is fastened to the upper half-housing 20 by means of the ends 112 and 114 of its two sides which are engaged on the body of the upper half-housing 20.

According to the invention, the removable cover 110 has an end part 120 which is extended beyond the orifice or cavity edge 44 of the compartment 46 in order, when it is in position on the upper half-housing 20, to extend above the sockets 32 making it possible to connect plugs of the type of the plug 122 indicated diagrammatically in FIG. 7.

This part 120 of the cover 110 has a series of four ports 124 which make it possible to connect the measuring lead 127 equipping the plug 122 in the socket 32 arranged opposite the port 124.

In the embodiment illustrated, of course, the four ports 124 are arranged symmetrically opposite four socket 32, to allow connection in different measuring positions.

The removable cover 110 also possesses indications 126 enabling the user to mark the position of the knob 128 of the control switch 28, in order to select the operating range of the measuring appliance. The knob 28 passes through the removable cover 110 via a circular recess 130 formed in the latter.

The battery compartment 46 is delimited by a side wall 132, the profile of which corresponds to that of the contour of the cavity edge 44, and by a bottom wall 134. These two walls 132 and 134 being produced in one piece with the integral part forming the upper half-housing 20.

The bottom wall 134 has orifices 136 and 138 allowing, in particular, the passage of the electrical connection members 140 and 142 of the fuses 48 and 50, and two orifices 144 allowing the passage of the connecting terminals 145 for the electrical connection of the battery 47.

To ensure sealing between the battery compartment and the inner cavity of the housing 38, there is a foam sealing diaphragm 146 which is arranged between the lower face of the bottom 134 and the upper face of the main printed-circuit board 36.

The foam sealing diaphragm 146 has slits which allow the fuse connection members 140, 142 and the battery connecting terminals 145 to pass through it sealingly.

The manner of access to the compartment containing the battery and fuses, for example to carry out the replacement of one of these elements, will now be described with particular reference to FIG. 7.

The user begins by disconnecting the plugs 122 which, if appropriate, are in place in the sockets 32 and which pass through the safety device 34, if the measuring appliance is equipped with such a device, and the ports 124 of the removable cover 110.

The user subsequently removes the safety member 34 engaged on the removable cover 110 and then this latter element which is engaged on the upper half-housing 20. If the user has not previously removed the plugs 122 and the safety device 34, it is impossible for him to remove the removable cover 110.

The user then has only to take out the flexible sealing diaphragm 90 in order to gain access to the compartment 46 and carry out the operations of checking and replacing the battery 47 and/or fuses 48 and 50.

The elements are put back in place in reverse order to that just described for the removal.

It will also be seen that, if the user happens to reinsert the plugs without having replaced the removable cover 110, it is difficult for him to use the measuring appliance, since there are no longer any indications 126 opposite the control knob 128 of the switch 28.

To make it possible to fit the fuses of different sizes equally in the same fuse-carrier members, such as the part 140, it will be seen that the latter possesses, starting from its insertion orifice 150, two successive cutouts 152 and 154, which make it possible to insert a fuse 48 of a diameter corresponding to that of the circular orifice 152 or to that of the circular orifice 154. This characteristic advantageously makes it possible to market the same appliance in countries having different standards as regards the diameters and sizes of the fuses to be used, for example 8×32 mm or 6.3×32 mm fuses.

In the embodiment illustrated, the battery 47 is a parallelepipedic 9-volt battery known by the standardized reference 6LF22.

The housing of the measuring appliance just described, with the arrangement of the battery compartment accessible from the functional control and operating face, is such that, during use and for normal maintenance, the user never has to open the main housing and need only have access to the compartment 46, in which the battery 47 and the fuses 48 and 50 are arranged.

In a way known per se, the lower half-housing 22 is equipped with a stand 200 which is articulated about an axis 202, to make it possible to use the appliance in a position inclined, for example, relative to a horizontal working plane.

According to a new characteristic, the free end 204 of the stand is bevelled so as to have a reduced thickness similar to that of the tip of a screwdriver. The stand, which is easily removable, can thus be detached from the housing of the appliance in order to form a dismantling tool.

In fact, the user can advantageously use the bevelled end 204 by inserting it into the parting plane 24 or the lateral ends 112 of the cover 110.

Since the stand 200 is produced from the same thermoplastic as the housings and the covers, it constitutes a tool non-aggressive towards these elements, thus avoiding accidental damage to them.

Although particular embodiments of the invention have been described and illustrated herein, it is recognized that modifications and variations may readily occur to those skilled in the art and consequently it is intended to cover such modifications and equivalents.

What is claimed is:

1. A battery-operated appliance comprising:
a housing having front and rear walls forming substantially parallel front and rear faces, said housing faces each having a largely rectangular shape with a width and length;
a plurality of manually operable controls and a display all lying on said front face;
a circuit board lying in said housing in a plane that is substantially parallel to said front and rear faces;
walls forming a battery compartment containing a battery, said compartment having a front with an access opening and having a rear wall;
said housing front face having an aperture aligned with said access opening, said access opening and aperture being large enough to pass said battery;
a removable cover which covers said aperture in said housing front face;
said circuit board lying behind said rear wall of said battery compartment and having a width and length that are each approximately as large as said width and length of said housing faces.

2. The appliance described in claim 1 wherein:
said appliance comprises a volt-ohmmeter which is capable of measuring voltages of over 100 volts, and having a plurality of plug-receiving ports in said housing front face and a plurality of sockets in said housing lying behind and aligned with said ports;
said plug-receiving ports being formed in said cover.

3. The appliance described in claim 1 wherein:
at least one of said controls includes a shaft extending to said circuit board.

4. In a battery-operable appliance of the type that includes a housing with a front face and an opposite rear face, at least one manually operable control on said front face, a battery compartment within said housing, and a replaceable battery in said compartment, the improvement wherein:
said housing has an orifice in said front face that opens to said battery compartment and through which said battery passes, and removable cover which covers said orifice;
said housing has front and rear walls and said battery compartment has a depth less than the distance between said front and rear walls;
said appliance includes a circuit board within said housing occupying substantially the entire width of said housing, and lying behind said battery compartment.

5. The improvement described in claim 4 wherein:
said battery compartment has a rear wall, said appliance includes an elastomeric diaphragm lying against the rear face of said compartment rear wall and forward of said circuit board, and said appliance includes as plurality of electrical contacts extending from said circuit board and through holes in said diaphragm and said compartment rear wall into said battery compartment.

6. In a portable battery-operable appliance of the type that includes a housing with a front face and an opposite rear face, a manually operable control on said front face, at least on plug-receiving port in said housing front face and a socket in said housing lying behind and aligned with said port, a battery compartment within said housing, and a replaceable battery in said compartment, said appliance also including a plug with an end that can pass through said port to mate with said socket, the improvement wherein:
said housing has an orifice in said front face that opens to said battery compartment and through which said battery passes, and a removable cover which covers said orifice;
said plug-receiving port lies in said removable cover, whereby to encourage removal of the plug when changing the battery.

7. In a battery-operable appliance of the type that includes a housing with a front face and an opposite rear face, a manually operable control on said front face, a battery compartment within said housing, and a replaceable battery in said compartment, the improvement wherein:
said housing has an orifice in said front face that opens to said battery compartment and through which said battery passes, and a removable cover which covers said orifice;
said manually operable control has an indicator and is moveable to a plurality of different positions;

said housing has a plurality of different markings each lying adjacent to said control indicator at each of said positions to indicate the position of the control;

said plurality of markings lying on said cover, whereby to discourage operation with the cover off.

8. The improvement described in claim 7 wherein:

said first control comprises a knob that is rotatable about an axis extending substantially perpendicular to said front face;

said cover has as hole with hole walls that extend about said control knob, said markings being spaced about said hole.

* * * * *